(12) United States Patent
Liu et al.

(10) Patent No.: US 12,213,339 B2
(45) Date of Patent: Jan. 28, 2025

(54) DISPLAY PANEL AND DISPLAY APPARATUS WITH PIXEL CIRCUITS BEHIND LIGHT BLOCKING ASSEMBLY

(71) Applicant: KunShan Go-Visionox Opto-Electronics Co., Ltd., Kunshan (CN)

(72) Inventors: Rusheng Liu, Kunshan (CN); Guanghui Wang, Kunshan (CN); Junfei Cai, Kunshan (CN); Junhui Lou, Kunshan (CN)

(73) Assignee: KunShan Go-Visionox Opto-Electronics Co., Ltd., Kunshan (CN)

( * ) Notice: Subject to any disclaimer, the term of this patent is extended or adjusted under 35 U.S.C. 154(b) by 446 days.

(21) Appl. No.: 17/591,262

(22) Filed: Feb. 2, 2022

(65) Prior Publication Data

US 2022/0158140 A1    May 19, 2022

Related U.S. Application Data

(63) Continuation of application No. PCT/CN2020/132462, filed on Nov. 27, 2020.

(30) Foreign Application Priority Data

Jan. 14, 2020   (CN) .......................... 202010037847.2

(51) Int. Cl.
H01L 51/52         (2006.01)
H01L 27/32         (2006.01)
(Continued)

(52) U.S. Cl.
CPC ....... *H10K 50/865* (2023.02); *H10K 59/1213* (2023.02); *H10K 59/122* (2023.02)

(58) Field of Classification Search
CPC .................................................... H10K 50/865
See application file for complete search history.

(56) References Cited

U.S. PATENT DOCUMENTS

| 2005/0073243 A1 | 4/2005 | Yamazaki et al. |
| 2017/0017105 A1 | 1/2017 | Ye et al. |

(Continued)

FOREIGN PATENT DOCUMENTS

| CN | 102082166 A | 6/2011 |
| CN | 103000661 A | 3/2013 |

(Continued)

OTHER PUBLICATIONS

International Search Report mailed on Feb. 26, 2021, in corresponding to International Application No. PCT/CN2020/132462; 7 pages (with English Translation).

(Continued)

*Primary Examiner* — Peter Bradford
(74) *Attorney, Agent, or Firm* — Maier & Maier, PLLC

(57) ABSTRACT

A display panel and display apparatus. The display panel includes a first display area, a second display area, and an isolation area. A light transmittance of the first display area is greater than a light transmittance of the second display area. At least a part of the isolation area is positioned between the first display area and the second display area. The display panel includes a plurality of first sub-pixels positioned in the first display area; a first pixel circuit positioned in the second display area, the first pixel circuit being electrically connected to the first sub-pixels in the first display area and being configured to drive the first sub-pixels in the first display area to display; and a light-blocking assembly positioned in the isolation area, the light-blocking assembly being configured to block light incident from the first sub-pixels to the first pixel circuit.

17 Claims, 6 Drawing Sheets

(51) Int. Cl.
    *H10K 50/86*     (2023.01)
    *H10K 59/121*    (2023.01)
    *H10K 59/122*    (2023.01)

(56)              References Cited

U.S. PATENT DOCUMENTS

2018/0259852 A1*  9/2018  Tanigaki ................ H10K 50/00
2021/0066648 A1*  3/2021  Chung ................. H10K 50/865
2022/0140006 A1*  5/2022  Ballot .................... H10K 39/32
                                                            257/40

FOREIGN PATENT DOCUMENTS

CN      107968113 A        4/2018
CN      207489875 U    *   6/2018
CN      109256399 A        1/2019
CN      109599030 A        4/2019
CN      208861990 U        5/2019
CN      110061014 A        7/2019
CN      110233167 A    *   9/2019   ........... H01L 27/323
CN      110444570 A       11/2019
CN      110634930 A       12/2019
CN      111211152 A        5/2020
KR     20070075920 A        7/2007

OTHER PUBLICATIONS

The First Office Action for Chinese Application No. 202010037847.
2, dated Apr. 7, 2021, 13 pages.
Notification to Grant Patent Right for Invention for Chinese Application No. 202010037847.2, dated Jun. 7, 2021, 6 pages.

* cited by examiner

DISPLAY PANEL AND DISPLAY APPARATUS WITH PIXEL CIRCUITS BEHIND LIGHT BLOCKING ASSEMBLY

CROSS-REFERENCE TO RELATED APPLICATIONS

This application is a continuation of International Application No. PCT/CN2020/132462 filed on Nov. 27, 2020, which claims the priority to Chinese patent application No. 202010037847.2 filed on Jan. 14, 2020, both of which are incorporated herein by reference in their entireties.

TECHNICAL FIELD

This application relates to the field of display, and particularly to a display panel and display apparatus.

BACKGROUND

With a rapid development of electronic devices, users have higher and higher requirements for screen-to-body ratios, such that the industry has shown more and more interest in all-screen displays of electronic devices.

There is a need for traditional electronic devices, such as mobile phones and tablets, to have front-facing cameras, earpieces, and infrared sensing components etc. integrated thereon. In the prior art, notches or holes may be provided on display screens, so that external light can enter photosensitive elements under the screens through the notches or holes on the screens. However, these electronic devices do not have actual all-screen displays, since not all regions across the screens can be used to display, for example, regions corresponding to front-facing cameras cannot be used to display pictures.

SUMMARY

Embodiments of the present application provide a display panel and display apparatus, enabling at least a part of regions of the display panel to be light-transmitting and display, so as to facilitate under-screen integration of photosensitive components.

In a first aspect, embodiments of the present application provide a display panel including a first display area, a second display area, and an isolation area. A light transmittance of the first display area is greater than a light transmittance of the second display area. At least a part of the isolation area is positioned between the first display area and the second display area. The display panel includes:
- a plurality of first sub-pixels positioned in the first display area;
- a first pixel circuit positioned in the second display area, the first pixel circuit being electrically connected to the first sub-pixels in the first display area and being configured to drive the first sub-pixels in the first display area to display; and
- a light-blocking assembly positioned in the isolation area, the light-blocking assembly being configured to block light incident from the first sub-pixels to the first pixel circuit.

In a second aspect, embodiments of the present application provide a display apparatus including the display panel according to any of the above implementations.

According to the display panel of the embodiments of the present application, the light transmittance of the first display area is greater than the light transmittance of the second display area, so that photosensitive components may be integrated on the back of the first display area of the display panel to achieve under-screen integration of the photosensitive components such as cameras, while the first display area can display pictures. Thus, a display area of the display panel can be increased and a full-screen design of the display apparatus can be realized.

DETAILED DESCRIPTION

Features and exemplary embodiments of various aspects of the present application will be described in detailed below. In order to make the objects, technical solutions and advantages of the present application clearer, the present application is further described in details below with reference to the accompany drawings and specific embodiments. It should be understood that the specific embodiments described herein are only for illustration of the present application, and are not for limiting the present application. For those skilled in the art, the present application can be implemented without some of those specific details. The below description of embodiments is only for providing better understanding of the present application by showing examples of the present application.

In an electronic device, such as a mobile phone and a tablet etc., there is a need to integrate photosensitive components (e.g., front-facing cameras, infrared light sensors, and proximity light sensors) on a side of the electronic device, the side of the electronic device is provided with a display panels. In some embodiments, a light-transmitting display area may be provided on the above-described electronic device, and the photosensitive components may be arranged on the back of the light-transmitting display area, such that full-screen display for the electronic device can be realized, while proper operations of the photosensitive components can be guaranteed.

At present, light emitted from sub-pixels in the light-transmitting display area can pass through the light-transmitting display area and reach to a channel of a pixel circuit within an opaque display area. As a result, a semiconductor of the pixel circuit may generate photo-generated carriers, which in turn cause Mura (uneven brightness display) in the display panel.

In order to solve the above problems, embodiments of the present application provide a display panel and a display apparatus. Various embodiments of the display panel and the display apparatus will be described below in connection with the accompanying drawings.

Embodiments of the present application provide a display panel, which may be an Organic Light Emitting Diode (Organic Light Emitting Diode, OLED) display panel.

Figure 1:
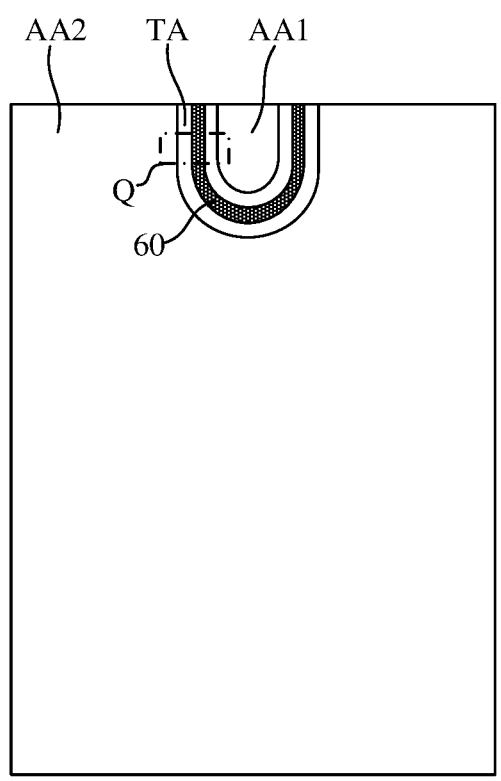
FIG. 1 shows a schematic top view of a display panel according to an embodiment of the present application.
Figure 2:
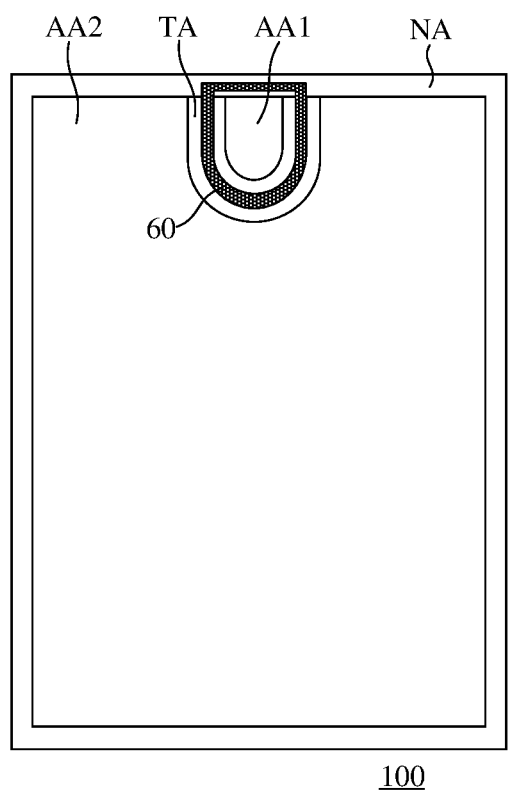
FIG. 2 shows a schematic top view of a display panel according to another embodiment of the present application.
Figure 3:
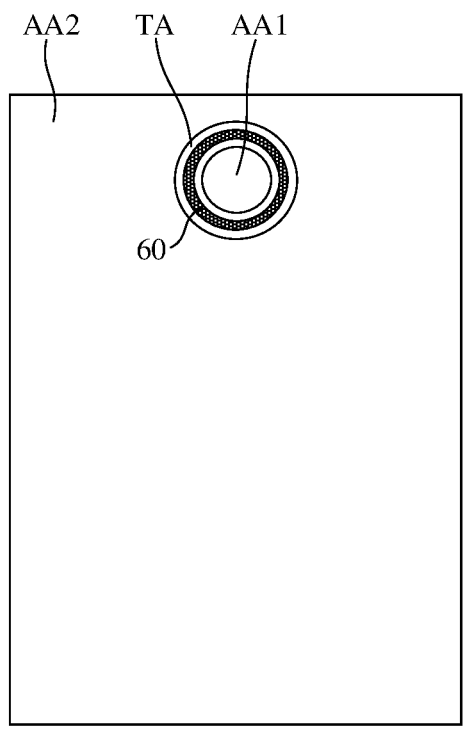
FIG. 3 shows a schematic top view of a display panel provided according to a further embodiment of the present application.
Figure 4:
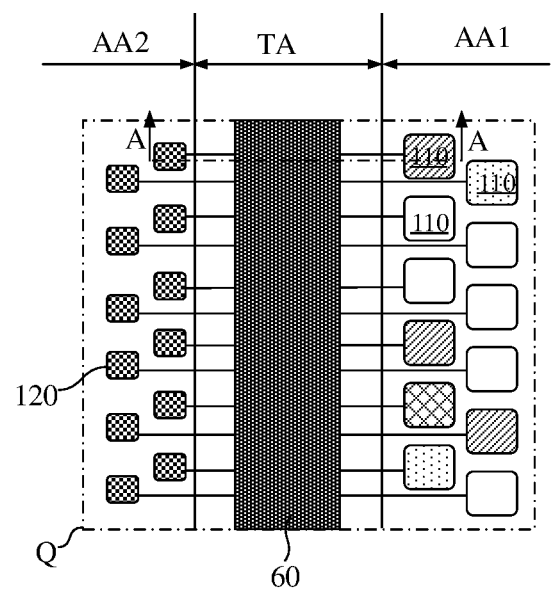
FIG. 4 shows a partial enlarged view of a Q region of FIG. 1 provided by an example.

FIG. 1 to FIG. 3 shows schematic top views of display panels provided according to three embodiments of the present application. FIG. 4 shows a partial enlarged view of a Q region of FIG. 1 provided by an example. FIG. 5 to FIG. 8 shows cross-sectional views along an A-A direction in FIG. 4 provided by four examples.

As shown in FIG. 1, a display panel 100 includes a first display area AA1, a second display area AA2, and an isolation area TA. A light transmittance of the first display area AA1 is greater than that of the second display area AA2. The first display area AA1 is positioned at edges of the display panel 100, and the isolation area TA is positioned between the first display area AA1 and the second display area AA2.

Exemplarily, as shown in FIG. 2, a display panel 100 includes a first display area AA1, a second display area AA2, an isolation area TA, and a non-display area NA. A light transmittance of the first display area AA1 is greater than a light transmittance of the second display area AA2. The second display area AA2 partially surrounds the first display area AA1. A part of the isolation area TA is positioned between the first display area AA1 and the second display area AA2, and another part of the isolation area TA is positioned between the first display area AA1 and the non-display area NA.

Exemplarily, as shown in FIG. 3, a display panel 100 includes a first display area AA1, a second display area AA2, and an isolation area TA. A light transmittance of the first display area AA1 is greater than a light transmittance of the second display area AA2. The first display area AA1 is completely surrounded by the second display area AA2. The isolation area TA is positioned between the first display area AA1 and the second display area AA2.

Particularly, a specific position of the isolation area TA may be set according to a position relationship between the first display area AA1 and the second display area AA2.

Here, it is preferable that the light transmittance of the first display area AA1 is greater than or equal to 15%. In order to ensure that the light transmittance of the first display area AA1 is greater than or equal to 15%, or even greater than 40% or more, light transmittances of at least some of functional film layers in the first display areas AA1 of the display panels 100 in the embodiments of the present application may be greater than 80%, or even greater than 90%.

According to the display panel 100 of the embodiments of the present application, the light transmittance of the first display area AA1 is greater than the light transmittance of the second display area AA2, so that photosensitive components may be integrated on the back of the first display area AA1 of the display panel 100 to achieve under-screen integration of the photosensitive components such as cameras, while the first display area AA1 can display pictures. Thus, a display area of the display panel 100 can be increased and a full-screen design of a display apparatus can be realized.

As shown in FIG. 4, the display panel 100 includes a plurality of first sub-pixels 110, a first pixel circuit 120 and a light-blocking assembly 60. The plurality of first sub-pixels 110 are positioned in the first display area AA1. The first pixel circuit 120 is positioned in the second display area AA2. The first pixel circuit 120 is electrically connected to the first sub-pixels 110 in the first display area AA1, and is configured to drive the first sub-pixels 110 in the first display area AA1 to display. The light-blocking assembly 60 is positioned in the isolation area TA, and is configured to block light incident from the first sub-pixels 110 to the first pixel circuit 120. In order to show a structure of the light-blocking assembly clearly, sub-pixels in the second display area AA2 and a pixel circuit driving the sub-pixels in the second display area AA2 are shown as hidden.

According to the display panel provided by the embodiment of the present application, the light-blocking assembly 60 is provided between the first display area AA1 and the second display area AA2, the light-blocking assembly 60 can block the light emitted from the first sub-pixels 110 in the first display area AA1 impinge on the first pixel circuit 120 in the second display area AA2, so as to prevent semiconductor devices in the pixel circuit from generating photo-generated carriers due to effect of light, and in turn avoid generating Mura in the first display area. Thereby, display quality of the display panel can be improved.

Exemplarily, as shown in FIG. 4, the first pixel circuit 120 is positioned in the second display area AA2 and close to the first display area AA1. The first pixel circuit 120 is electrically connected to the sub-pixels 110 in the first display area AA1 through leads. The leads may be transparent leads, such as indium tin oxide (Indium Tin Oxide, ITO) leads or indium zinc oxide leads, in order to further increase the light transmittance of the first display area AA1.

As shown in FIG. 3, the isolation area TA is arranged around an entire periphery of the first display area AA1. An orthographic projection of the light-blocking assembly 60 in a thickness direction of the display panel 100 appears as a closed pattern around the first display area AA1. The light-blocking assembly 60 can completely block the light emitted from the first sub-pixels 110 in the first display area AA1 impinge on the first pixel circuit 120 in the second display area AA2, so as to completely prevent semiconductor devices in the pixel circuit from generating photo-generated carriers due to effect of light, and in turn avoid generating Mura in the first display area. Thereby, display quality of the display panel can be further improved.

Figure 5:
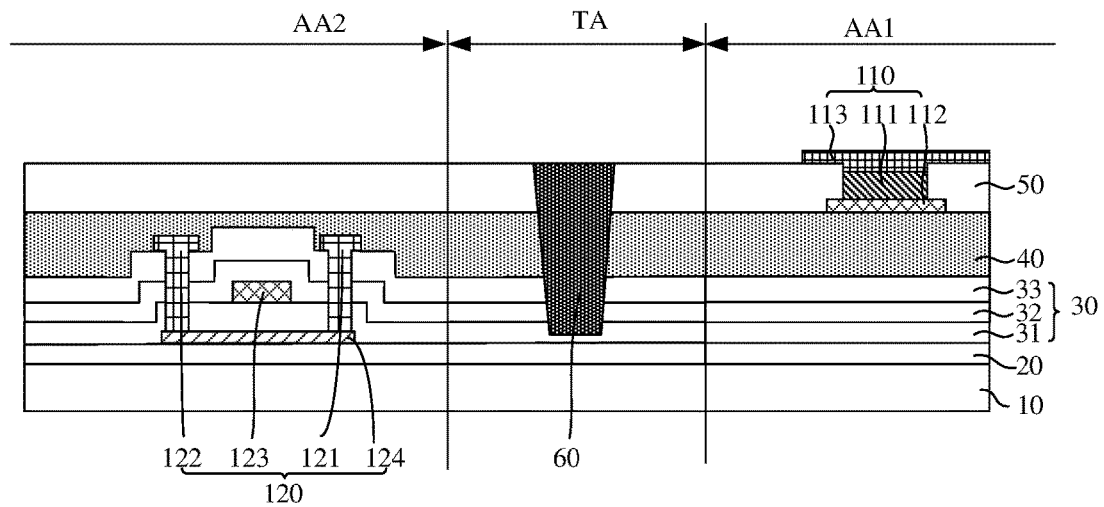
FIG. 5 shows a cross-sectional view along an A-A direction in FIG. 4 provided by a first example.

In some embodiments, as shown in FIG. 5, the display panel 100 may include a substrate 10, a component layer 30, a planarization layer 40 and a pixel-defining layer 50. The component layer 30 is positioned on the substrate 10, the planarization layer 40 is positioned on the component layer 30, and the pixel-defining layer 50 is positioned on the planarization layer 40. Particularly, the first pixel circuit 120 is positioned in the component layer 30. The light-blocking assembly 60 extends through at least a part of the component layer 30 in the thickness direction of the display panel 100, and the light-blocking assembly 60 extends through the planarization layer 40 and the pixel-defining layer 50. That is, the light-blocking assembly 60 extends through planarization layer 40 and the pixel-defining layer 50 completely in the thickness direction of the display panel 100, and may extend through only a part of the component layer 30 in the thickness direction of the display panel 100.

In some embodiments, the substrate 10 may be made of a light-transmitting material such as a glass or polyimide (Polyimide, PI). A buffer layer 20 may be provided between the substrate 10 and the component layer 30.

In some embodiments, the component layer 30 may include a first insulating layer 31, a second insulating layer 32, and an interlayer dielectric layer 33 which are stacked. The first insulating layer 31 is arranged close to the substrate 10, and the interlayer dielectric layer 33 is arranged away from the substrate 10. Exemplarily, as shown in FIG. 5, the light-blocking member 60 may extend to the first insulating layer 31 in the thickness direction of the display panel 100.

According to the embodiments of the present application, the light-blocking assembly 60 extends through at least a part of the component layer 30 in the thickness direction of the display panel 100, and the light-blocking assembly 60 extends through the planarization layer 40 and the pixel-defining layer 50. That is to say, the light-blocking assembly 60 may begin to block the light emitted from the first sub-pixels 110 in the first display area AA1 impinge on the first pixel circuit 120 in the second display area AA2, at a position close to the first sub-pixels 110 in the first display area AA1, so as to fundamentally prevent the first pixel circuit 120 in the second display area AA2 from being affected by the light emitted from the first sub-pixels 110 in the first display area AA1.

In some embodiments, the first pixel circuit 120 may include a thin film transistor. The thin film transistor may include an active layer. The component layer 30 may include a limiting layer 01. The limiting layer 01 is arranged on the same layer as the active layer of the thin film transistor. The light-blocking assembly 60 extends from a surface of the pixel-defining layer 50 away from the substrate 10 to a surface of the limiting layer 01 away from the substrate 10.

Embodiments of the present application do not limit a specific structure of the first pixel circuit 120. FIG. 5 to FIG. 8 show a thin film transistor in the first pixel circuit 120. It should be understood that the first pixel circuit 120 may include a plurality of thin film transistors and a plurality of capacitors.

Figure 6:
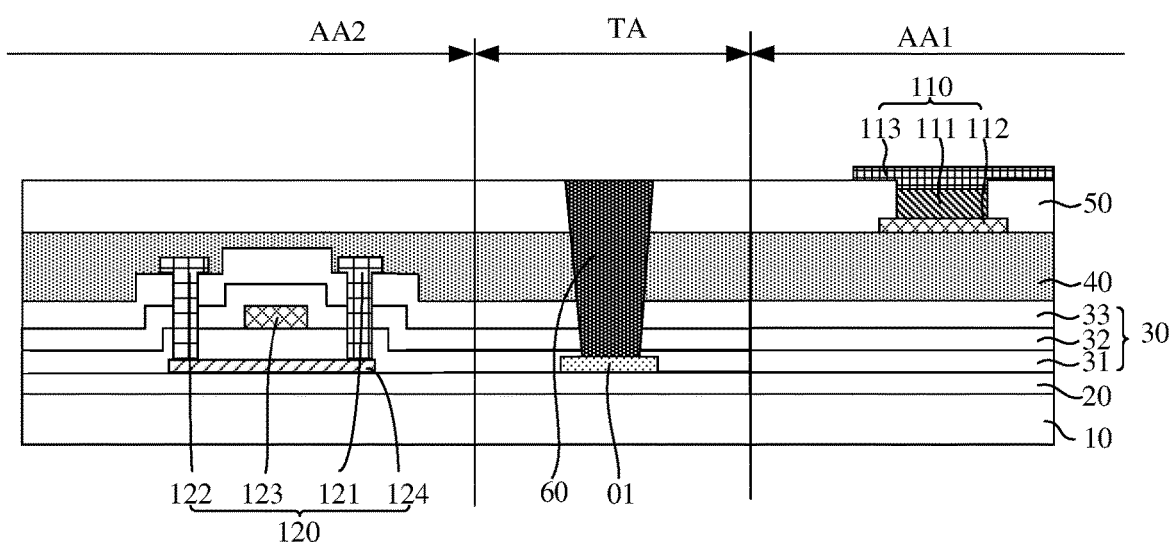
FIG. 6 shows a cross-sectional view along the A-A direction in FIG. 4 provided by a second example.

As shown in FIG. 6, the thin film transistor may include a drain 121, a source 122, a gate 123 and an active layer 124. The gate 123 is positioned between the first insulating layer 31 and the second insulating layer 32. The source 122 and the drain 121 are positioned on the interlayer dielectric layer 33 and contact with the active layer 124 through through-holes in the first insulating layer 31, the second insulating layer 32 and the interlayer dielectric layer 33. Exemplarily, the active layer 124 is a semiconductor layer.

Exemplarily, a recessed portion may be formed firstly, which is recessed from the surface of the pixel-defining layer 50 away from the substrate 10 to the surface of the limiting layer 01 away from the substrate 10. The limiting layer 01 is exposed at the bottom of the recessed portion. Further, a light-blocking material, for example, a black organic light-blocking material, may be filled in the recessed portion, to form the light-blocking assembly 60. The limiting layer 01 is used to limit the depth of the recessed portion to prevent the recessed portion from being too deep, that is, to prevent the light-blocking assembly 60 from extending to the substrate 10 and avoid causing a problem of damaging the substrate 10. In addition, the limiting layer 01 may be a semiconductor layer, and may be formed in the same process step as the active layer 124 of the thin film transistor.

Figure 7:
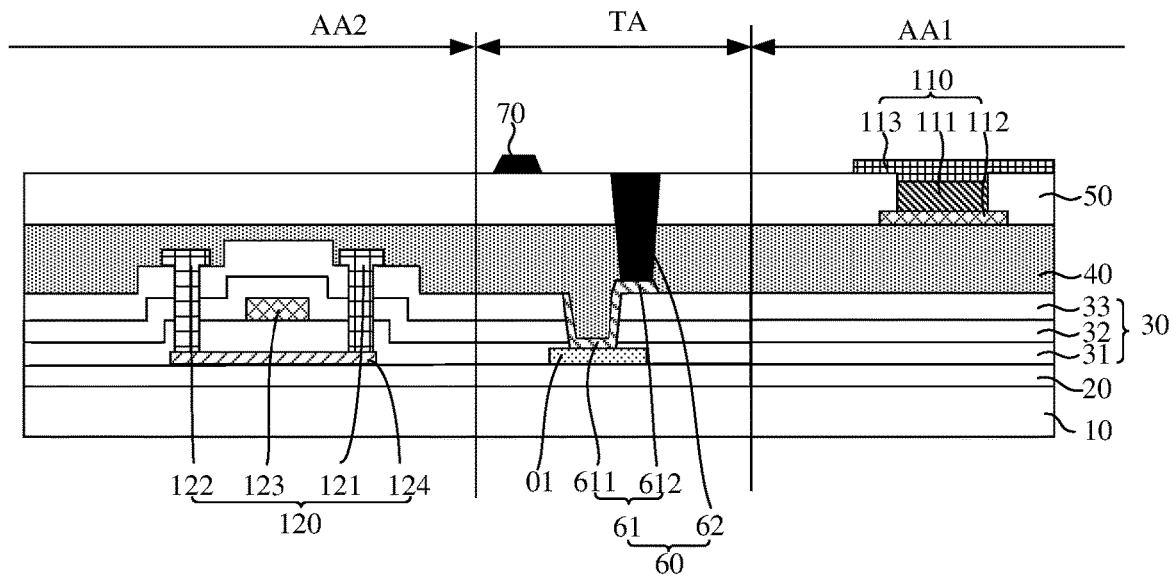
FIG. 7 shows a cross-sectional view along the A-A direction in FIG. 4 provided by a third example.

In some embodiments, as shown in FIG. 7, the light-blocking assembly 60 may include a first light-blocking unit 61 and a second light-blocking unit 62. The first light-blocking unit 61 may include a first light-blocking portion 611 and a first connecting portion 612. The first light-blocking portion 611 may extend between a surface of the component layer 30 away from the substrate 10 and the surface of the limiting layer 01 away from the substrate 10. The first connecting portion 612 may be connected with the first light-blocking portion 611, and may extend along the surface of the component layer 30 away from the substrate 10. The second light-blocking unit 62 may extend between the surface of the pixel-defining layer 50 away from the substrate 10 and the first connecting portion 612.

The first light-blocking portion 611 and the first connecting portion 612 may be formed as an integrated structure. Exemplarily, a recessed portion may be formed firstly, which is recessed from the surface of the interlayer dielectric layer 33 away from the substrate 10 to the surface of the limiting layer 01 away from the substrate. Then, the first light-blocking portion 611 and the first connecting portion 612 may be formed integrally at a position which is the inner wall of the recessed portion and the surface of the interlayer dielectric layer 33 which is away from the substrate 10 and is close to the recessed portion. The first light-blocking portion 611 and the first connecting portion 612 included in the first light-blocking unit 61 may be formed in the same process step as the drain 121 and the source 122 of the first pixel circuit 120.

According to the embodiments of the present application, the first light-blocking unit 61 and the drain 121 and the source 122 of the first pixel circuit 120 are formed simultaneously by one process step. As a result, the complexity of manufacturing processes of the display panel 100 can be reduced, while the light emitted from the first sub-pixels 110 in the first display area AA1 can be prevented from impinging on the first pixel circuit 120 in the second display area AA2.

In some embodiments, the component layer 30 may include at least one metal layer. A material of the first light-blocking unit 61 may be the same with a material of the metal layer. Exemplarily, the metal layer may be the drain 121 and the source 122 of the first pixel circuit 120. A material of the first light-blocking unit 61 may be the same with a material of the drain 121 and the source 122 of the first pixel circuit 120, which further reduces the complexity of the manufacturing process.

In some embodiments, as shown in FIG. 7, the display panel 100 may further include a supporting column 70. The support column 70 may be arranged on the pixel-defining layer 50. The second light-blocking unit 62 may be an integrated structure, and a material of the second light-blocking unit 62 may be the same with a material of the supporting column 70. The material of the second light-blocking unit 62 and the material of the supporting column 70 may both be a black organic material, such as black organic glue. Exemplarily, a recessed portion may be formed firstly, which is recessed from the surface of the pixel-defining layer 50 away from the substrate 10 to the surface of the first connection portion 612 away from the substrate 10. The supporting columns 70 and the second light-blocking unit 62 recessed portion may then be formed simultaneously by one process step, to reduce the complexity of manufacturing processes of the display panel 100.

Figure 8:
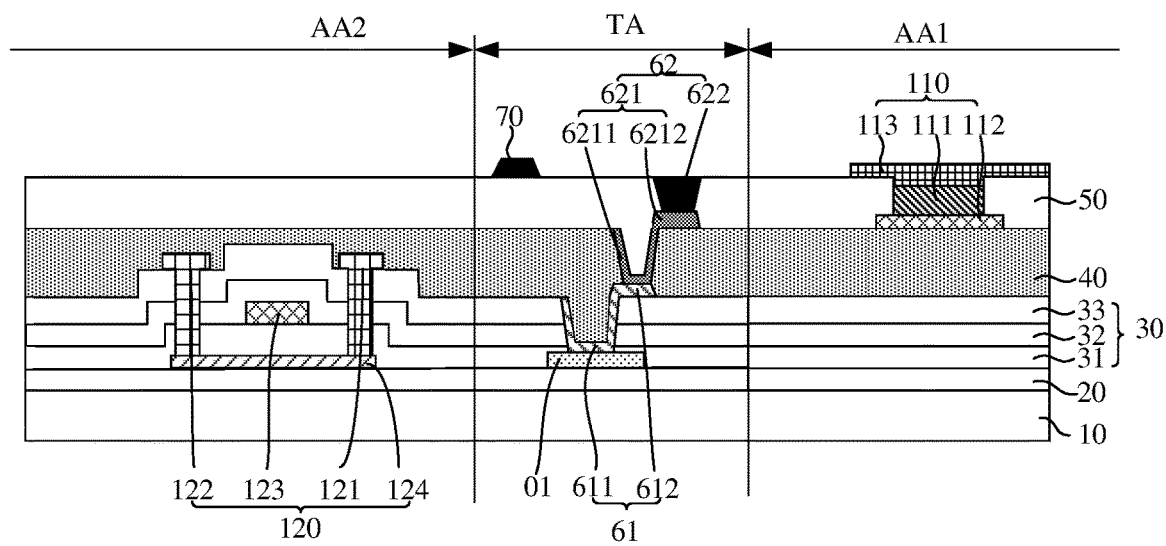
FIG. 8 shows a cross-sectional view along the A-A direction in FIG. 4 provided by a fourth example.

In some embodiments, as shown in FIG. 8, the second light-blocking unit 62 may include a first light-blocking sub-unit 621 and a second light-blocking sub-unit 622. The first light-blocking sub-unit 621 may extend between a surface of the planarization layer 40 away from the substrate 10 and the first connecting portion 612. The second light-blocking sub-unit 622 may extend between the surface of the pixel-defining layer 50 away from the substrate 10 and the first light-blocking sub-unit 621.

Exemplarily, a recessed portion may be formed firstly, and the recessed portion is recessed from the surface of the planarization layer 40 away from the substrate 10 to the surface of the first connecting portion 612 away from the substrate 10, and then the first light-blocking sub-unit is formed in the recessed portion 621. Further, a recess portion may be formed firstly, which is recessed from the surface of the pixel-defining layer 50 away from the substrate 10 to a surface of the first light-blocking sub-unit 621 away from the substrate 10. The second light-blocking sub-unit 622 may then be formed in the recessed portion.

The second light-blocking unit 62 is provided with two light-blocking sub-units, which can avoid an area and depth of the recessed portion being too large during the manufacturing process, and in turn control an area and a depth in the display panel 100 occupied by the light-blocking assembly 60, so as to avoid an area and depth of the light-blocking assembly 60 being too large, which affects the display effect of the display panel, while the light of the sub-pixels 110 in the first display area AA1 can be prevented from impinging on the first pixel circuit.

In some embodiments, as further shown in FIG. 8, the first light-blocking sub-unit 621 may include a second light-blocking portion 6211 and a second connecting portion 6212. The second light-blocking portion 6211 may extend between the surface of the planarization layer 40 away from the substrate 10 and the first connecting portion 612. The second connecting portion 6212 may be connected with the second light-blocking portion 6211 and may extend along the surface of the planarization layer 40 away from the substrate 10. The second light-blocking sub-unit 622 may be connected with the second connecting portion 6212.

The second light-blocking portion 6211 and the second connecting portion 6212 may be formed as an integrated structure. Exemplarily, a recessed portion may be formed firstly, which is recessed from the surface of the planarization layer 40 away from the substrate 10 to a surface of the first connecting part 612 away from the substrate 10. The second light-blocking portion 6211 and the second connecting portion 6212 may then be formed integrally at a position which is the inner wall of the recessed portion and the surface of the planarization layer 40 which is away from the substrate 10 and is close to the recessed portion. Further, each of the first sub-pixels 110 may include a first electrode 112, a light-emitting structure 111 and a second electrode 113 which are stacked. The first electrode 112 may be positioned on the planarization layer 40.

In some embodiments, a material of the first light-blocking sub-unit 621 may be the same with a material of the first electrode 112. A material of the second light-blocking sub-unit 622 may be the same with a material of the supporting column 70.

According to the embodiments of the present application, the first light-blocking sub-unit 621 and the first electrode 112 are formed simultaneously by one process step, and the second light-blocking sub-unit 622 and the supporting column 70 are formed simultaneously by one process step. As a result, the complexity of the manufacturing processes of the display panel 100 can be reduced, while the light emitted from the first sub-pixels 110 in the first display area AA1 can be prevented from impinging on the first pixel circuit 120 in the second display area AA2.

In some embodiments, an orthographic projection of the first light-blocking portion 611, an orthographic projection of the second light-blocking portion 621, and an orthographic projection of the second light-blocking sub-unit 622 on the substrate do not overlap with each other. In the process of forming the light-blocking assembly 60, such arrangement can reduce the area of the recessed portion as much as possible. That is, such arrangement can avoid negative effects on the display panel 100 caused by too large area occupied by the light-blocking assembly 60.

In some embodiments, one of the first electrode 112 and the second electrode 113 is an anode, and the other is a cathode. In this embodiment, an example that the first electrode 112 is an anode and the second electrode 113 is a cathode is described for illustration.

The first light-emitting structure 111 may include an OLED light-emitting layer. According to a design requirement of the first light-emitting structure 111, the first light-emitting structure 111 may also include at least one of a hole injection layer, a hole transport layer, an electron injection layer, and an electron transport layer.

In some embodiments, the first electrode 112 positioned in the first display area AA1 may be a light-transmitting electrode. In some embodiments, the first electrode 112 positioned in the first display area AA1 may include an indium tin oxide (Indium Tin Oxide, ITO) layer or an indium zinc oxide layer. In some embodiments, the first electrode 112 positioned in the first display area AA1 is a reflective electrode, including a first light-transmitting conductive layer, a reflective layer on the first light-transmitting conductive layer, and a second light-transmitting conductive layer on the reflective layer. The first light-transmitting conductive layer and the second light-transmitting conductive layer may be made of ITO, IZO, etc., and the reflective layer may be a metal layer, for example, may be made of silver.

In some embodiments, the second electrode 113 positioned in the first display area AA1 may include a magnesium-silver alloy layer. In some embodiments, the second electrodes 113 positioned in the first display area AA1 may be interconnected to be a common electrode.

In some embodiments, a projection of each first light-emitting structure 111 in the first display area AA1 in a direction perpendicular to the display panel 100 may be composed of one first graphic unit or composed of two or more first graphic units. The first graphic unit may include at least one selected from a group consisting of a circle, an oval, a dumbbell shape, a gourd shape, and a rectangle.

In some embodiments, a projection of each first electrode 112 in the first display area AA1 in the direction perpendicular to the display panel 100 may be composed of one second graphic unit or composed of two or more second graphic units. The second graphic unit may include at least one selected from a group consisting of a circle, an oval, a dumbbell shape, a gourd shape, and a rectangle.

The above-mentioned shapes can change a periodic structure which can produce diffraction (i.e., change distribution of the diffraction field), so as to reduce a diffraction effect generated when external incident light passes through the first display area AA1, and thereby ensure that images captured by cameras arranged under the first display area AA1 have high a definition.

Exemplarily, the display panel 100 may further include an encapsulation layer and a polarizer and a cover plate positioned above the encapsulation layer. Or, the cover plate may be directly arranged above the encapsulation layer without a need for the polarizer. Alternatively, the cover plate may be directly arranged at least above the encapsulation layer of the first display area AA1 without a need for the polarizer, in order to prevent the polarizer from affecting light collection amount of corresponding photosensitive elements arranged under the first display area AA1. Of course, the polarizer may also be arranged above the encapsulation layer of the first display area AA1.

Embodiments of the present application also provide a display apparatus, which may include the display panel 100 of any of the foregoing embodiments. An embodiment of the display apparatus is taken as an example for illustration below. In this embodiment, the display apparatus includes the display panel 100 of the above-mentioned embodiments.

Figure 9:
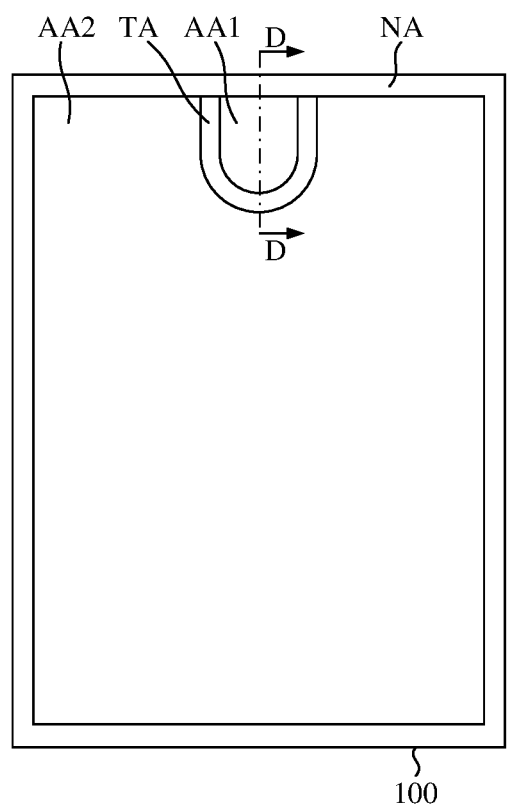
FIG. 9 shows a schematic top view of a display apparatus according to an embodiment of the present application.
Figure 10:
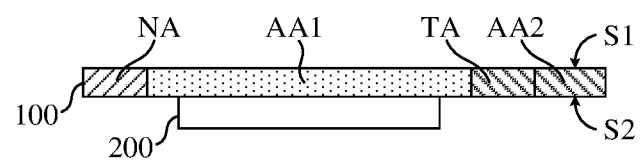
FIG. 10 shows a cross-sectional view along a D-D direction in FIG. 9 provided by an example.

FIG. 9 shows a schematic top view of a display apparatus according to an embodiment of the present application. FIG. 10 shows a cross-sectional view along a D-D direction in FIG. 9 provided by an embodiment. In this embodiment of the display apparatus, the display panel 100 may be the display panel 100 according to any of the above embodiments. The display panel 100 includes the first display area AA1 and the second display area AA2. The light transmittance of the first display area AA1 is greater than the light transmittance of the first display area AA2.

The display panel 100 may include a first surface S1 and a second surface S2 which are opposite to each other. The first surface S1 is a display surface. The display apparatus may further include a photosensitive component 200, which is positioned on side of the display panel 100 corresponding to the second surface S2. The photosensitive component 200 may correspond to the position of the first display area AA1.

The photosensitive component 200 may be an image acquisition equipment which may be used to acquire external image information. In this embodiment, the photosensitive component 200 is complementary metal oxide semiconductor (Complementary Metal Oxide Semiconductor, CMOS) image acquisition equipment, and in some other embodiments, the photosensitive component 200 may be another type of image acquisition equipment, such as charge-coupled device (Charge-coupled Device, CCD) image acquisition equipment. It may be understood that the photosensitive component may not be limited to the image acquisition equipment, and in some embodiments, the photosensitive component 200 may be a light sensor such as an infrared sensor, a proximity sensor, an infrared lens, a flood light sensor, an ambient light sensor, and a dot matrix projector etc., for example. In addition, in the display apparatus, other elements such as a receiver or a speaker, may also be integrated on the side of the display panel 100 corresponding to the second surface S2.

According to the display apparatus of the embodiments of the present application, the light transmittance of the first display area AA1 is greater than the light transmittance of the second display area AA2, so that the photosensitive component 200 may be integrated on the back of the display panel 100 corresponding to the first display area AA1, so as to achieve under-screen integration of the photosensitive component 200 such as image acquisition equipment, while the first display area AA1 can display pictures. Thus, the display area of the display panel 100 can be increased and a full-screen design of the display apparatus can be realized.

According to the display panel of the embodiments of the present application, the first pixel circuit for driving the first sub-pixels in the first display area to display is positioned in the second display area, such that a wiring structure in the first display area can be reduced, and light transmittance of the first display area can be increased in turn.

According to the display panel of the embodiment of the present application, the display panel further includes the isolation area positioned between the first display area and the second display area. The isolation area includes the light-blocking assembly provided therein, the light-blocking assembly prevent light emitted from the first sub-pixels in the first display area from impinging on the first pixel circuit, so as to prevent semiconductor devices in the pixel circuit from generating photo-generated carriers due to effect of light, and in turn avoid generating Mura in the first display area. Thereby, a display quality of the display panel can be improved.

According to the above-mentioned embodiments of the present application, these embodiments do not describe all details exhaustively, nor do they limit the application to only the specific embodiments described. Obviously, according to the above description, many modifications and changes can be made. This specification selects and describes these embodiments in details, in order to better explain principles and practical applications of this application, such that those skilled in the art can make good use of this application and make modifications on the basis of this application. This application is only limited by the claims and their full scope and equivalents.

What is claimed is:

1. A display panel comprising a first display area, a second display area, and an isolation area, a light transmittance of the first display area being greater than a light transmittance of the second display area, and at least a part of the isolation area being positioned between the first display area and the second display area, the display panel comprising:
   a plurality of first sub-pixels positioned in the first display area;
   a first pixel circuit positioned in the second display area, the first pixel circuit being electrically connected to the first sub-pixels in the first display area and being configured to drive the first sub-pixels in the first display area to display; and
   a light-blocking assembly positioned in the isolation area, the light-blocking assembly being configured to block light incident from the first sub-pixels to the first pixel circuit.

2. The display panel of claim 1, wherein the isolation area is arranged around an entire periphery of the first display area, and an orthographic projection of the light-blocking assembly in a thickness direction of the display panel appears as a closed pattern around the first display area.

3. The display panel of claim 1, wherein the display panel comprises:
   a substrate;
   a component layer positioned on the substrate, the first pixel circuit being positioned in the component layer;
   a planarization layer positioned on the component layer; and
   a pixel-defining layer positioned on the planarization layer;
   wherein the light-blocking assembly extends through at least a part of the component layer in a thickness direction of the display panel, and the light-blocking assembly extends through the planarization layer and the pixel-defining layer.

4. The display panel of claim 3, wherein the component layer comprises a first insulating layer, a second insulating layer, and an interlayer dielectric layer which are stacked, and the first insulating layer is arranged close to the substrate and the interlayer dielectric layer is arranged away from the substrate,
   the light-blocking assembly extends to the first insulating layer in the thickness direction of the display panel.

5. The display panel of claim 4, wherein the first pixel circuit comprises a plurality of thin film transistors, each of the thin film transistors comprises a drain, a source, a gate, and an active layer, the gate is positioned between the first insulating layer and the second insulating layer, and the source and the drain are positioned on the interlayer dielectric layer and contact with the active layer through through-holes in the first insulating layer, the second insulating layer, and the interlayer dielectric layer.

6. The display panel of claim 3, wherein the first pixel circuit comprises a thin film transistor, the thin film transistor comprises an active layer, the component layer comprises a limit layer arranged in a same layer with the active layer of the thin film transistor, and the light-blocking assembly extends from a surface of the pixel-defining layer away from the substrate to a surface of the limit layer away from the substrate.

7. The display panel of claim 6, wherein the light-blocking assembly comprises:

a first light-blocking unit comprising a first light-blocking portion and a first connecting portion, the first light-blocking portion extending between a surface of the component layer away from the substrate and the surface of the limit layer away from the substrate, and the first connecting portion being connected with the first light-blocking portion and extending along the surface of the component layer away from the substrate; and a second light-blocking unit extending between the surface of the pixel-defining layer away from the substrate and the first connecting portion.

8. The display panel of claim 7, wherein the first light-blocking portion and the first connecting portion are formed as an integrated structure.

9. The display panel of claim 7, wherein the component layer comprises at least one metal layer, and a material of the first light-blocking unit is the same as a material of the metal layer.

10. The display panel of claim 7, wherein the display panel further comprises a supporting column arranged on the pixel-defining layer; and the second light-blocking unit is an integrated structure, and a material of the second light-blocking unit is same with a material of the supporting column.

11. The display panel of claim 7, wherein the second light-blocking unit comprises:

a first light-blocking sub-unit extending between a surface of the planarization layer away from the substrate and the first connecting portion; and a second light-blocking sub-unit extending between the surface of the pixel-defining layer away from the substrate and the first light-blocking sub-unit.

12. The display panel of claim 11, wherein the first light-blocking sub-unit comprises a second light-blocking portion and a second connecting portion, the second light-blocking portion extends between the surface of the planarization layer away from the substrate and the first connecting portion, the second connecting portion is connected with the second light-blocking portion and extends along the surface of the planarization layer away from the substrate, and the second light-blocking sub-unit is connected with the second connecting portion.

13. The display panel of claim 12, wherein an orthographic projection of the first light-blocking portion on the substrate, an orthographic projection of the second light-blocking portion on the substrate, and an orthographic projection of the second light-blocking sub-unit on the substrate do not overlap with each other.

14. The display panel of claim 12, wherein the second light-blocking portion and the second connecting portion are formed as an integrated structure.

15. The display panel of claim 11, wherein the display panel further comprises a supporting column arranged on the pixel-defining layer, and a material of the second light-blocking sub-unit is same with a material of the supporting column.

16. The display panel of claim 11, wherein each of the first sub-pixels comprises a first electrode, a first light-emitting structure on the first electrode, and a second electrode on the first light-emitting structure, wherein a material of the first light-blocking sub-unit is same with a material of the first electrode.

17. A display apparatus comprising the display panel of claim 1.

* * * * *